(12) United States Patent
Dusterhoft et al.

(10) Patent No.: US 9,217,318 B2
(45) Date of Patent: Dec. 22, 2015

(54) DETERMINING A TARGET NET TREATING PRESSURE FOR A SUBTERRANEAN REGION

(71) Applicant: Halliburton Energy Services, Inc., Houston, TX (US)

(72) Inventors: Ronald Glen Dusterhoft, Katy, TX (US); David Blair Allison, Spring, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 457 days.

(21) Appl. No.: 13/804,335

(22) Filed: Mar. 14, 2013

(65) Prior Publication Data

US 2014/0278316 A1    Sep. 18, 2014

(51) Int. Cl.
G06G 7/48  (2006.01)
E21B 43/26  (2006.01)
E21B 43/25  (2006.01)

(52) U.S. Cl.
CPC ............... *E21B 43/26* (2013.01); *E21B 43/25* (2013.01)

(58) Field of Classification Search
CPC ......... E21B 43/26; E21B 47/00; E21B 43/00; E21B 43/25; E21B 49/00; E21B 43/20; E21B 47/06; G06G 7/48; G06G 7/57; G06F 17/10; G06F 17/50; G06F 17/40; G06F 19/00; G01V 1/30; G01V 1/28
See application file for complete search history.

(56) References Cited

U.S. PATENT DOCUMENTS

| | | |
|---|---|---|
| 5,183,109 A | 2/1993 | Poulsen |
| 5,482,116 A | 1/1996 | El-Rabaa et al. |
| 5,747,750 A | 5/1998 | Bailey et al. |
| 5,992,519 A | 11/1999 | Ramakrishnan et al. |
| 6,389,361 B1 | 5/2002 | Geiser |
| 6,581,685 B2 | 6/2003 | Burgess et al. |
| 7,610,183 B2 | 10/2009 | Danko |
| 7,788,037 B2 | 8/2010 | Soliman et al. |
| 8,210,257 B2 | 7/2012 | Dusterhoft et al. |
| 8,371,382 B2 | 2/2013 | Dusterhoft et al. |
| 2002/0043370 A1 | 4/2002 | Poe |
| 2003/0050758 A1 | 3/2003 | Soliman et al. |
| 2003/0051873 A1* | 3/2003 | Patzek et al. ............... 166/252.1 |
| 2005/0171751 A1 | 8/2005 | Siebrits et al. |
| 2005/0229680 A1 | 10/2005 | Kfoury et al. |
| 2006/0219402 A1 | 10/2006 | Lecampion |
| 2007/0062273 A1 | 3/2007 | Kalfayan et al. |
| 2007/0272407 A1 | 11/2007 | Lehman et al. |

(Continued)

OTHER PUBLICATIONS

Authorized Officer Jong Kyung Lee, PCT International Search Report and Written Opinion of the International Searching Authority, PCT/US2014/016569, Jul. 18, 2014, 17 pages.

(Continued)

*Primary Examiner* — Kandasamy Thangavelu
(74) *Attorney, Agent, or Firm* — Craig W. Roddy; Fish & Richardson P.C.

(57) ABSTRACT

In some aspects, a target net treating pressure for an injection treatment of a subterranean region is determined. Fracture growth orientation in a subterranean region is modeled by a computer system. In the model, the fracture growth is a response to fluid pressure acting on the subterranean region. A target net treating pressure for fluid acting on the subterranean region during an injection treatment of the subterranean region is determined based on the modeled fracture growth orientations.

26 Claims, 5 Drawing Sheets

(56) References Cited

U.S. PATENT DOCUMENTS

| | | | |
|---|---|---|---|
| 2007/0294034 A1* | 12/2007 | Bratton et al. | 702/6 |
| 2008/0004847 A1 | 1/2008 | Bradford | |
| 2008/0060846 A1 | 3/2008 | Belcher et al. | |
| 2008/0133186 A1 | 6/2008 | Li et al. | |
| 2008/0183451 A1 | 7/2008 | Weng et al. | |
| 2009/0090504 A1 | 4/2009 | Weightman et al. | |
| 2009/0260823 A1 | 10/2009 | Prince-Wright et al. | |
| 2010/0032156 A1 | 2/2010 | Petty et al. | |
| 2010/0057418 A1 | 3/2010 | Li et al. | |
| 2010/0076738 A1 | 3/2010 | Dean et al. | |
| 2010/0224365 A1 | 9/2010 | Abad | |
| 2010/0269578 A1 | 10/2010 | Detournay et al. | |
| 2010/0307755 A1 | 12/2010 | Xu et al. | |
| 2010/0312529 A1 | 12/2010 | Souche et al. | |
| 2011/0029293 A1 | 2/2011 | Petty et al. | |
| 2011/0067857 A1 | 3/2011 | Underhill et al. | |
| 2011/0120702 A1 | 5/2011 | Craig | |
| 2011/0120705 A1 | 5/2011 | Walters et al. | |
| 2011/0120706 A1 | 5/2011 | Craig | |
| 2011/0120718 A1* | 5/2011 | Craig | 166/308.1 |
| 2011/0125471 A1 | 5/2011 | Craig et al. | |
| 2011/0125476 A1 | 5/2011 | Craig | |
| 2011/0213602 A1 | 9/2011 | Dasari | |
| 2011/0240296 A1 | 10/2011 | Dusterhoft et al. | |
| 2012/0043077 A1 | 2/2012 | Edwards | |
| 2012/0150515 A1* | 6/2012 | Hariharan et al. | 703/7 |
| 2012/0158310 A1 | 6/2012 | Adams et al. | |
| 2012/0325462 A1 | 12/2012 | Roussel et al. | |
| 2013/0140020 A1* | 6/2013 | Suarez-Rivera et al. | 166/250.1 |
| 2013/0140031 A1* | 6/2013 | Cohen et al. | 166/308.1 |
| 2013/0158959 A1* | 6/2013 | Gu et al. | 703/2 |
| 2013/0238304 A1* | 9/2013 | Glinsky | 703/6 |
| 2014/0076543 A1* | 3/2014 | Ejofodomi et al. | 166/250.1 |
| 2014/0262232 A1 | 9/2014 | Dusterhoft et al. | |
| 2014/0299315 A1* | 10/2014 | Chuprakov et al. | 166/250.1 |
| 2014/0305638 A1* | 10/2014 | Kresse et al. | 166/250.1 |

OTHER PUBLICATIONS

"HiWay—Flow-Channel Hydraulic Fracturing Technique for Vertical Completions", Schlumberger, Dec. 2010, 2 pages.

"HiWay—Flow-Channel Hydraulic Fracturing Workflow for Shale Formations", Schlumberger, Jan. 2013, 2 pages.

"AccessFrac PD Service Helps Avert Loss of Well and Cuts Completion Time by Over 50%", Halliburton, Copyright 2012, 2 pages.

"Product Announcement—Halliburton Introduces AccessFrac Service", Halliburton, published on or before Oct. 31, 2011, 2 pages.

Smith, Michael B., "Stimulation Design for Short, Precise Hydraulic Fractures," Society of Petroleum Engineers, Jun. 1985, pp. 371-379, 9 pages.

Nolte, Kenneth G., et al., "Interpretation of Fracturing Pressures," Society of Petroleum Engineers of AIME, Sep. 1981, pp. 1767-1775, 9 pages.

* cited by examiner

DETERMINING A TARGET NET TREATING PRESSURE FOR A SUBTERRANEAN REGION

BACKGROUND

The following description relates to determining a target net treating pressure for a subterranean region. The effective permeability of a subterranean rock formation can be increased by fracturing the rock. For example, hydraulic fracture treatments are often used to fracture shale, coal, and other types of rock formations. During a hydraulic fracture treatment, fluids are pumped into the formation (e.g., through a wellbore) under high pressure, and the pressure of the fluid in the formation fractures the rock.

SUMMARY

In a general aspect, a target net treating pressure is determined for an injection treatment based on computer modeling.

In some aspects, fracture growth in a subterranean region is modeled by a computer system. The modeling indicates a fracture growth orientation in response to modeled fluid pressures acting on the subterranean region. Based on the fracture growth orientation indicated by the model, a target net treating pressure is determined for an injection treatment of the subterranean region.

Implementations may include one or more of the following features. The target net treating pressure is a fluid pressure that dilates natural fractures in the subterranean region and propagates dominant fractures that are perpendicular to a minimum horizontal stress orientation in the subterranean region. The target net treating pressure dilates the natural fractures by inducing leak-off from the dominant fractures. Dilating the natural fractures in the subterranean region increases an effective permeability of the subterranean region.

Additionally or alternatively, these and other implementations may include one or more of the following features. A maximum net treating pressure is determined in relation to the difference between minimum and maximum horizontal stresses in the subterranean region. The modeled fluid pressures are selected in relation to the difference between the minimum and maximum horizontal stresses in the subterranean region. The target net treating pressure is a maximum net treating pressure associated with a fracture growth orientation that is perpendicular to a minimum stress orientation in the subterranean region.

Additionally or alternatively, these and other implementations may include one or more of the following features. Connected fracture surface area and stimulated volume in the subterranean region are identified based on the modeling. The target net treating pressure is determined based on maximizing at least one of the connected fracture surface area or the stimulated volume.

Additionally or alternatively, these and other implementations may include one or more of the following features. The target net treating pressure is determined based on one or more of the modeled fluid pressures. The target net treating pressure includes a range of net treating pressures between a minimum target value and a maximum target value. The injection treatment includes a multi-stage fracturing treatment, and the target net treating pressure is selected to propagate one or more of multiple non-intersecting dominant fractures initiated by the multi-stage fracture treatment.

The details of one or more embodiments of these concepts are set forth in the accompanying drawings and the description below. Other features, objects, and advantages of these concepts will be apparent from the description and drawings, and from the claims.

DESCRIPTION OF DRAWINGS

Like reference symbols in the various drawings indicate like elements.

DETAILED DESCRIPTION

Some aspects of what is described here can be used to improve or optimize hydraulic fracture treatment designs. For example, hydraulic fracture treatments can be designed for multi-stage horizontal well completions or other types of completions in unconventional reservoirs or other types of subterranean formations. Some aspects of what is described here can be used to provide validation (e.g., in real time during an injection treatment, or post-treatment) to ensure that the desired treatment properties are achieved. In some instances, the techniques described here can enable both the design engineer and the operations engineer to improve the design and delivery of hydraulic fracturing treatments.

In some implementations, a target net treating pressure is determined. The target net treating pressure can refer to an optimal, favorable, or otherwise designated value or range of values of net treating pressure. In the context of an injection treatment, the net treating pressure indicates the extent to which the fluid pressure applied to the subterranean rock (e.g., the bottom hole treating pressure) exceeds the rock closure stress (e.g., the minimum horizontal rock stress). As such, a target net treating pressure may indicate a desired net treating pressure to be applied to the rock formation by an injection treatment. The actual net treating pressure can be observed during the injection treatment, and the fluid injection can be modified (e.g., by increasing or decreasing fluid pressure) when the actual net treating pressure falls outside (above or below) the target range.

Generally, the pressure of injected fluids acting on the rock formation during a fracture treatment can initiate, dilate, or propagate hydraulic fractures. For example, hydraulically induced or created fractures can be initiated at or near the perforations in the wellbore casing, and the fractures can grow from the wellbore in the direction of maximum horizontal stress. As another example, the injection treatment can induce leak-off and dilate natural fractures in the rock formation. Dilating natural fractures can increase the stimulated reservoir volume and the connected fracture surface area. But excessively high net treating pressure can lead to fracture reorientations and interconnections of dominant fractures, which hinder the increase of the stimulated reservoir volume and the connected fracture surface area.

Some of the techniques described here can be used to determine a target net treating pressure that maximizes or otherwise improves the stimulated reservoir volume and the connected fracture surface area. In some instances, the target net treating pressure can be determined based on modeling fracture growth orientation in the subterranean region. For example, in some cases, the target net treating pressure is the maximum net treating pressure that can be achieved without causing undesired fracture reorientation. In some instances, the target maximum net treating pressure can be determined in relation to a difference between minimum and maximum horizontal stresses in the subterranean region. In some instances, the target net treating pressure optimizes or otherwise improves the injection treatment design toward maximizing resource production from the subterranean region.

Some of the techniques described here can be used in controlling an injection treatment. For example, the actual net treating pressure can be determined and compared against a target net treating pressure. Based on the comparison, the injection treatment can be modified to achieve an actual net treating pressure complied with the target net treating pressure. In a given context, there may be multiple suitable measurements and calculations that can be used to determine the actual net treating pressure based on fluid pressures measured during the injection treatment. For example, the pressure of fluid in the injection string can be measured at or near the ground surface (e.g., at the well head), and the measured fluid pressure can be used as a basis for calculating the bottom hole treating pressure (e.g., compensating for friction losses, etc.); the actual net treating pressure can be determined, in some instances, based on subtracting the fracture closure pressure from the calculated bottom hole treating pressure.

In some implementations, if the actual net treating pressure exceeds the target net treating pressure, the injection treatment can be modified to reduce the actual net treating pressure, for example, by decreasing a pumping pressure, by injecting blocking materials into the subterranean region, or by other techniques. In some implementations, if the actual net treating pressure is below the target net treating pressure, the injection treatment can be modified to increase the actual net treating pressure, for example, by increasing a pumping pressure, by diversion methods, stress interference methods, or any other techniques. In some instances, the treatment parameters or pumping schedules can be modified in real time on location to improve the fracture growth behavior and maximize the production potentials of the subterranean region.

Figure 1A:
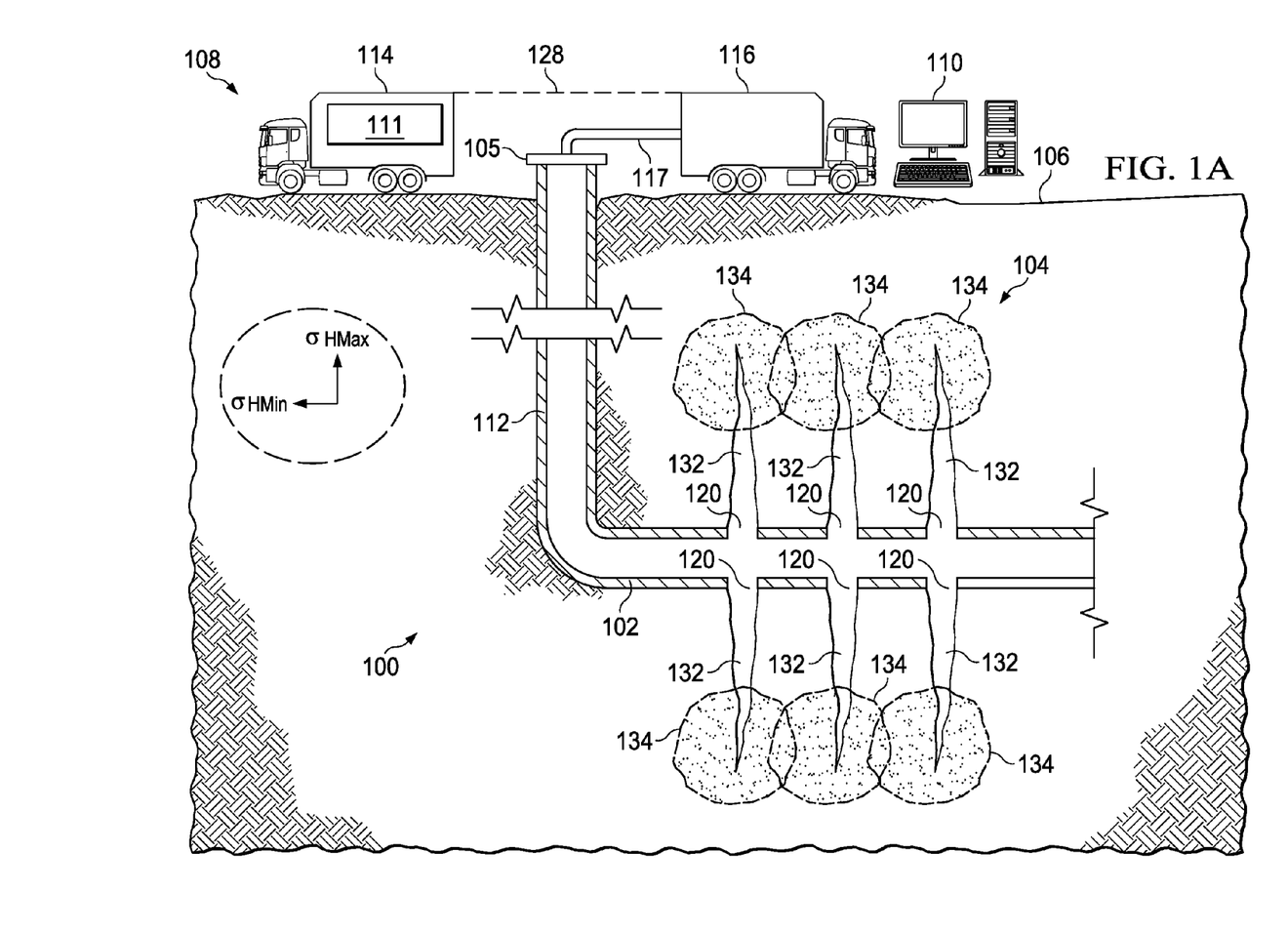
FIG. 1A is a schematic diagram of an example well system.

FIG. 1A is a diagram of an example well system 100 with a computing subsystem 110. The example well system 100 includes a wellbore 102 in a subterranean region 104 beneath the ground surface 106. The example wellbore 102 shown in FIG. 1A includes a horizontal wellbore. However, a well system may include any combination of horizontal, vertical, slant, curved, or other wellbore orientations. The well system 100 can include one or more additional treatment wells, observation wells, or other types of wells. The computing subsystem 110 can include one or more computing devices or systems located at the wellbore 102, or in other locations. The computing subsystem 110 or any of its components can be located apart from the other components shown in FIG. 1A. For example, the computing subsystem 110 can be located at a data processing center, a computing facility, or another suitable location. The well system 100 can include additional or different features, and the features of the well system can be arranged as shown in FIG. 1A or in another configuration.

The example subterranean region 104 may include a reservoir that contains hydrocarbon resources, such as oil, natural gas, or others. For example, the subterranean region 104 may include all or part of a rock formation (e.g., shale, coal, sandstone, granite, or others) that contain natural gas. The subterranean region 104 may include naturally fractured rock or natural rock formations that are not fractured to any significant degree. The subterranean region 104 may include tight gas formations that include low permeability rock (e.g., shale, coal, or others).

The example well system 100 shown in FIG. 1A includes an injection system 108. The injection system 108 can be used to perform an injection treatment, whereby fluid is injected into the subterranean region 104 through the wellbore 102. In some instances, the injection treatment fractures part of a rock formation or other materials in the subterranean region 104. In such examples, fracturing the rock may increase the surface area of the formation, which may increase the rate at which the formation conducts fluid resources to the wellbore 102. For example, a fracture treatment may augment the effective permeability of the rock by creating high permeability flow paths that permit native fluids (e.g., hydrocarbons, etc.) to weep out of the reservoir rock into the fracture and flow through the reservoir to the wellbore. The injection system 108 may utilize selective fracture valve control, information on stress fields around hydraulic fractures, real time fracture mapping, real time fracturing pressure interpretation, or other techniques to achieve desirable complex fracture geometries in the subterranean region 104.

A fracture treatment can be applied at a single fluid injection location or at multiple fluid injection locations in a subterranean zone, and the fluid may be injected over a single time period or over multiple different time periods. In some instances, a fracture treatment can use multiple different fluid injection locations in a single wellbore, multiple fluid injection locations in multiple different wellbores, or any suitable combination. Moreover, the fracture treatment can inject fluid through any suitable type of wellbore, such as, for example, vertical wellbores, slant wellbores, horizontal wellbores, curved wellbores, or any suitable combination of these and others.

The example injection system 108 can inject treatment fluid into the subterranean region 104 from the wellbore 102. The injection system 108 includes instrument trucks 114, pump trucks 116, and an injection treatment control subsystem 111. The example injection system 108 may include other features not shown in the figures. The injection system 108 may apply the injection treatments described with respect to FIGS. 2-4 or other types of injection treatments. The injection system 108 may apply injection treatments that include, for example, a multi-stage fracturing treatment, a single-stage fracture treatment, a mini-fracture test treatment, a follow-on fracture treatment, a re-fracture treatment, a final fracture treatment, other types of fracture treatments, or a combination of these.

The pump trucks 116 can include mobile vehicles, immobile installations, skids, hoses, tubes, fluid tanks, fluid reservoirs, pumps, valves, mixers, or other types of structures and equipment. The example pump trucks 116 shown in FIG. 1A can supply treatment fluid or other materials for the injection treatment. The pump trucks 116 may contain multiple different treatment fluids, proppant materials, or other materials for different stages of a stimulation treatment.

The example pump trucks 116 can communicate treatment fluids into the wellbore 102 at or near the level of the ground surface 106. The treatment fluids are communicated through the wellbore 102 from the ground surface 106 level by a conduit installed in the wellbore 102. The conduit 112 may include casing cemented to the wall of the wellbore 102. In some implementations, all or a portion of the wellbore 102 may be left open, without casing. The conduit 112 may include a working string, coiled tubing, sectioned pipe, or other types of conduit.

The instrument trucks 114 can include mobile vehicles, immobile installations, or other suitable structures. The example instrument trucks 114 shown in FIG. 1A include an injection treatment control subsystem 111 that controls or monitors the injection treatment applied by the injection system 108. The communication links 128 may allow the instrument trucks 114 to communicate with the pump trucks 116, or other equipment at the ground surface 106. Additional communication links may allow the instrument trucks 114 to communicate with sensors or data collection apparatus in the well system 100, remote systems, other well systems, equipment installed in the wellbore 102 or other devices and equipment. In some implementations, communication links allow the instrument trucks 114 to communicate with the computing subsystem 110 that can run injection simulations and provide injection treatment parameters. The well system 100 can include multiple uncoupled communication links or a network of coupled communication links. The communication links can include wired or wireless communications systems, or a combination thereof.

The injection system 108 may also include surface and down-hole sensors (not shown) to measure pressure, rate, fluid density, temperature or other parameters of treatment or production. For example, the injection system 108 may include pressure meters or other equipment that measure the pressure of fluids in the wellbore 102 at or near the ground surface 106 level or at other locations. The injection system 108 may include pump controls or other types of controls for starting, stopping, increasing, decreasing or otherwise controlling pumping as well as controls for selecting or otherwise controlling fluids pumped during the injection treatment. The injection treatment control subsystem 111 may communicate with such equipment to monitor and control the injection treatment.

The injection system 108 may inject fluid into the formation above, at or below a fracture initiation pressure for the formation; above, at or below a fracture closure pressure for the formation; or at another fluid pressure. Fracture initiation pressure may refer to a minimum fluid injection pressure that can initiate or propagate fractures in the subterranean formation. Fracture closure pressure may refer to a minimum fluid injection pressure that can dilate existing fractures in the subterranean formation. In some instances, the fracture closure pressure is related to the minimum principle stress acting on the formation. The net treating pressure may, in some instances, refer to a bottom hole treating pressure (e.g., at perforations 120) minus a fracture closure pressure or a rock closure stress. The rock closure stress may refer to the native stress in the formation that counters the fracturing of the rock.

The example injection treatment control subsystem 111 shown in FIG. 1A controls operation of the injection system 108. The injection treatment control subsystem 111 may include data processing equipment, communication equipment, or other systems that control injection treatments applied to the subterranean region 104 through the wellbore 102. The injection treatment control subsystem 111 may be communicably linked to the computing subsystem 110 that can calculate, select, or optimize fracture treatment parameters for initialization, propagation, or opening fractures in the subterranean region 104. The injection treatment control subsystem 111 may receive, generate or modify an injection treatment plan (e.g., a pumping schedule) that specifies properties of an injection treatment to be applied to the subterranean region 104.

In some instances, the injection treatment control subsystem 111 may interface with controls of the injection system. For example, the injection treatment control subsystem 111 may initiate control signals that configure the injection system 108 or other equipment (e.g., pump trucks, etc.) to execute aspects of the injection treatment plan. The injection treatment control subsystem 111 may receive data collected from the subterranean region 104 or another subterranean region by sensing equipment, and the injection treatment control subsystem 111 may process the data or otherwise use the data to select or modify properties of an injection treatment to be applied to the subterranean region 104. The injection treatment control subsystem 111 may initiate control signals that configure or reconfigure the injection system 108 or other equipment based on selected or modified properties.

In some implementations, the injection treatment control subsystem 111 controls the injection treatment in real time based on measurements obtained during the injection treatment. For example, pressure meters, flow monitors, microseismic equipment, fiber optic cables, temperature sensors, acoustic sensors, tiltmeters, or other equipment can monitor the injection treatment. In some implementations, observed fluid pressures can be used to determine when and in what manner to change the treatment parameters to achieve desired fracture properties. For example, the injection treatment control subsystem 111 may control and change the net treating pressure of an injection treatment to improve or maximize fracture volume or connected fracture surface area. Controlling the net treating pressure may include modifying pumping pressures, modifying pumping rates, modifying pumping volumes, modifying proppant concentrations, modifying fluid properties (for example, by adding or removing gelling agents to adjust viscosity), using diversion techniques, using stress interference techniques, optimizing or otherwise adjusting spacing between perforations, fracturing stages, or hydraulically induced fractures to control the degree of stress interference between fracturing stages, or any other appropriate methods to maintain the net treating pressure within a desirable value or range.

In the example shown in FIG. 1A, the injection system 108 has fractured the subterranean region 104. The fractures 132 may include fractures of any length, shape, geometry or aperture, that extend from perforations 120 along the wellbore 102 in any direction or orientation. The fractures 132 may be formed by hydraulic injections at multiple stages or intervals, at different times or simultaneously. Fractures formed by a hydraulic injection tend to form along or approximately along a preferred fracture direction, which is typically related to the stress in the formation. In the example shown, the preferred fracture direction is perpendicular to the wellbore 102.

The example fractures 132 shown in FIG. 1A, which are initiated by an injection treatment, extend from the wellbore 102 and terminate in the subterranean region 104. The fractures 132 initiated by the injection treatment can be the dominant or main fractures in the region near the wellbore 102. The fractures 132 may extend through regions that include natural fracture networks 134, regions of un-fractured rock, or both. The natural fracture networks 134 can be described in terms of their fracture density, fracture length, fracture conductivity, etc. In the example shown, the dominant fractures 132 intersect the natural fracture networks 134. Through the dominant fracture, high pressure hydraulic fracturing fluid can flow in the natural fracture networks 134 and induce dilation of natural fractures and leak off of the fluid into the natural fractures.

In some instances, by dilation of natural fractures, use of reactive fluids, use of very small, micron sized proppant materials, or other appropriate treatments, the conductivity or effective permeability of the dilated natural fractures can remain at least an order of magnitude higher than the matrix permeability of the rock itself. In some examples, if the matrix permeability of the reservoir rock is 100 nano Darcys, then the effective permeability of the dilated fracture would be at least 1000 nano Darcys or 1 micro Darcy. These dilated, leak off induced fractures then provide a path to the dominant hydraulic fracture to increase the exposed surface area and enhance the ability of hydrocarbon to flow through the created fracture system and into the wellbore.

Stresses of varying magnitudes and orientations may be present within a subterranean formation. In some cases, stresses in a subterranean formation may be effectively simplified to three principal stresses. For example, stresses may be represented by three orthogonal stress components, which include a horizontal "x" component along an x-axis, a horizontal "y" component along a y-axis, and a vertical "z" component along a z-axis. Other coordinate systems may be used. The three principal stresses may have different or equal magnitudes. Stress contrast or stress anisotropy refers to a difference in magnitude between stress in a direction of maximum horizontal stress and stress in a direction of minimum horizontal stress in the formation.

In some instances, it may be assumed that the stress acting in the vertical direction is approximately equal to the weight of formation above a given location in the subterranean region 104. With respect to the stresses acting in the horizontal directions, one of the principal stresses may be of a greater magnitude than the other. In FIG. 1A, the vector labeled $\sigma_{HMax}$ indicates the magnitude of the stress in the direction of maximum horizontal stress in the indicated locations, and the vector labeled $\sigma_{HMin}$ indicates the magnitude of the stress in the direction of minimum horizontal stress in the indicated locations. As shown in FIG. 1A, the directions of minimum and maximum horizontal stress may be orthogonal. In some instances, the directions of minimum and maximum stress may be non-orthogonal. In FIG. 1A, the stress anisotropy in the indicated locations is the difference in magnitude between $\sigma_{HMax}$ and $\sigma_{HMin}$. In some implementations, $\sigma_{HMax}$, $\sigma_{HMin}$, or both may be determined by any suitable method, system, or apparatus. For example, one or more stresses may be determined by a logging run with a dipole sonic wellbore logging instrument, a wellbore breakout analysis, a fracturing analysis, a fracture pressure test, or combinations thereof.

In some cases, the presence of horizontal stress anisotropy within a subterranean region or within a fracturing interval may affect the manner in which fractures form in the region or interval. In a very brittle rock with ideal stress conditions of low stress anisotropy, hydraulic fracturing can create (or reopen) large, complex natural fracture networks. Under these conditions, fracture jobs can create a lattice pattern with increased reservoir contact. On the other hand, highly anisotropic stresses may impede the formation of, modification of, or hydraulic connectivity to complex fracture networks. For example, the presence of significant horizontal stress anisotropy in a formation may cause fractures to open along substantially a single orientation. Because the stress in the subterranean formation is greater in an orientation parallel to $\sigma_{HMax}$ than in an orientation parallel to $\sigma_{HMin}$, a fracture in the subterranean formation may resist opening at an orientation perpendicular to $\sigma_{HMax}$. The created fracture may tend to be more planar in nature with natural fractures creating a source for fluid loss or leak off during fracturing. Some formations tend to develop less complex fracture systems generating less reservoir contact, but can still potentially activate any natural fractures that may exist through fluid leak off. Maximizing reservoir contact in this environment may require closer fracture spacing or diversion type solutions to increase the net treating pressure to overcome the stress anisotropy, activate natural fractures that may be present and promote more fracture complexity.

The example fractures 132 shown in FIG. 1A were initiated at the perforations 120 by a fracture treatment, and the fractures 132 grew from the wellbore 102 into the subterranean region 104. In the example shown in FIG. 1A, the fractures 132 grew in the direction of the maximum horizontal stress, and the fracture growth orientation is perpendicular to the direction of minimum horizontal stress. In some instances, increasing the net treating pressure (e.g., above a critical or threshold pressure) can cause the fracture growth to reorient. For example, the dominant fractures can begin to grow along the natural fractures, in directions that are not perpendicular to the minimum horizontal stress. Consequently, in a multi-stage fracturing treatment, reorientation of dominant fracture growth at different stages of the treatment can cause the dominant fractures to intersect each other. As such, the pressure signature associated with intersecting dominant fractures can be used to optimize or otherwise modify fracture spacing, perforation spacing, or other factors to minimize or otherwise reduce the likelihood of fracture reorientation.

In some implementations, the injection treatment can be designed to produce generally parallel, non-intersecting dominant fractures, as shown in FIG. 1A, or another desired fracture orientation. For example, computer modeling and numerical simulations can be used to determine the maximum net treating pressure that produces a desired fracture growth orientation. In some instances, maintaining the net treating pressure below the stress anisotropy (i.e., the difference between the maximum and minimum horizontal stresses) produces fracture growth in the maximum horizontal stress direction, while increasing the net treating pressure above the stress anisotropy can cause the fractures to grow at other orientations. As such, the target range of net treating pressure can have an upper limit that is designed to prevent fracture reorientation; and in some instances, the upper limit can be determined based at least in part on the stress anisotropy in the formation. Other factors, such as connected fracture surface area, fracture volume, and production volume can be considered in selecting the target net treating pressure.

In some implementations, the injection treatment can be designed to initiate fractures at the wellbore 102 and dilate natural fractures in the natural fracture networks 134. For example, computer modeling and numerical simulations can be used to determine the minimum net treating pressure that dilates natural fractures. The target range of net treating pressure can have a lower limit that is selected to ensure that natural fractures are dilated by the fracture treatment. In some cases, the lower limit of the target net treating pressure is selected to ensure that fractures are initiated and propagated in the formation at a desired time or growth rate. In some instances, no lower limit is specified.

Some of the techniques and operations described herein may be implemented by a one or more computing systems configured to provide the functionality described. In various embodiments, a computing system may include any of various types of devices, including, but not limited to, personal computer systems, desktop computers, laptops, notebooks, mainframe computer systems, handheld computers, workstations, tablets, application servers, storage devices, or any type of computing or electronic device.

Figure 1B:
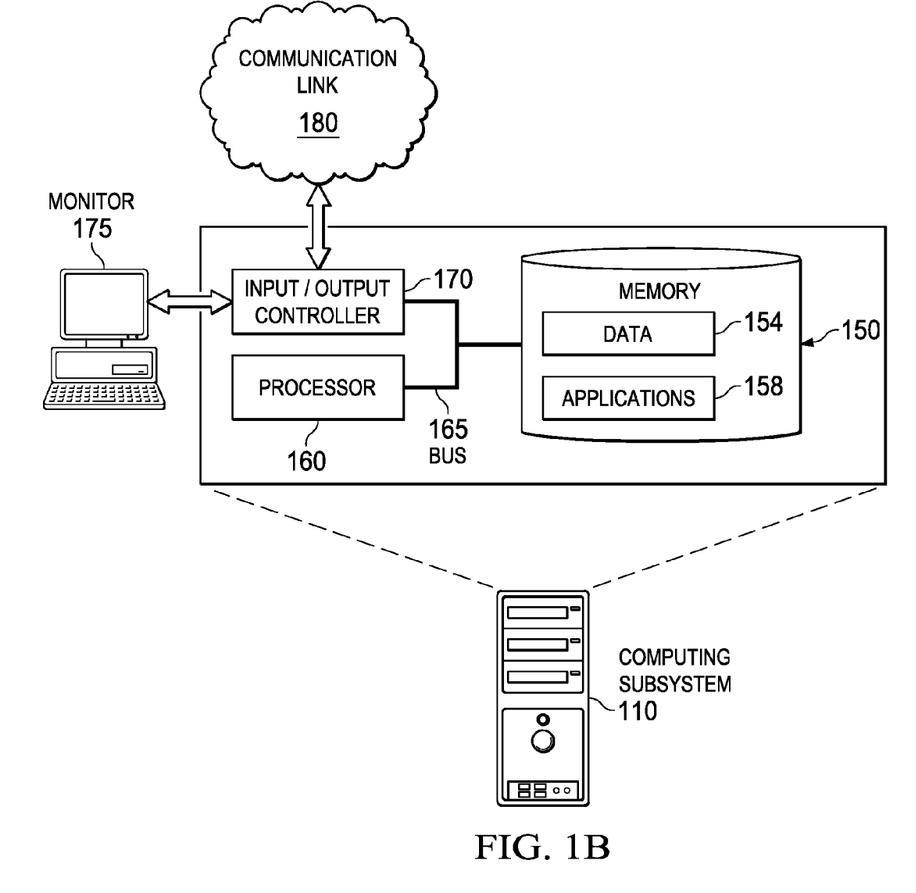
FIG. 1B is a diagram of the example computing subsystem 110 of FIG. 1A.

The example computing subsystem 110 shown in FIGS. 1A and 1B can simulate an injection treatment of the subterranean region 104. For example, the computing subsystem 110 can simulate and predict fracture initialization and propagation during fracture treatments applied through the wellbore 102. The simulation may rely on a fracture simulation system that can reflect the actual physical process of fracture treatments. The computing subsystem 110 can design or modify fracture treatments based on the simulations. For example, the computing subsystem 110 may calculate, select, or optimize fracture treatment parameters for initialization, propagation, or opening fractures in the subterranean region 104.

FIG. 1B is a diagram of the example computing subsystem 110 of FIG. 1A. The example computing subsystem 110 can be located at or near one or more wells of the well system 100 or at a remote location. All or part of the computing subsystem 110 may operate independent of the well system 100 or independent of any of the other components shown in FIG. 1A. The example computing subsystem 110 includes a memory 150, a processor 160, and input/output controllers 170 communicably coupled by a bus 165. The memory can include, for example, a random access memory (RAM), a storage device (e.g., a writable read-only memory (ROM) or others), a hard disk, or another type of storage medium. The computing subsystem 110 can be preprogrammed or it can be programmed (and reprogrammed) by loading a program from another source (e.g., from a CD-ROM, from another computer device through a data network, or in another manner). In some examples, the input/output controller 170 is coupled to input/output devices (e.g., a monitor 175, a mouse, a keyboard, or other input/output devices) and to a communication link 180. The input/output devices receive and transmit data in analog or digital form over communication links such as a serial link, a wireless link (e.g., infrared, radio frequency, or others), a parallel link, or another type of link.

The communication link 180 can include any type of communication channel, connector, data communication network, or other link. For example, the communication link 180 can include a wireless or a wired network, a Local Area Network (LAN), a Wide Area Network (WAN), a private network, a public network (such as the Internet), a WiFi network, a network that includes a satellite link, or another type of data communication network.

The memory 150 can store instructions (e.g., computer code) associated with an operating system, computer applications, and other resources. The memory 150 can also store application data and data objects that can be interpreted by one or more applications or virtual machines running on the computing subsystem 110. As shown in FIG. 1B, the example memory 150 includes data 154 and applications 158. The data 154 can include treatment data, geological data, fracture data, microseismic data, or any other appropriate data. The applications 158 can include a fracture design model, a reservoir simulation tool, a fracture simulation model, or any other appropriate applications. In some implementations, a memory of a computing device includes additional or different data, application, models, or other information.

In some instances, the data 154 include treatment data relating to fracture treatment plans. For example the treatment data can indicate a pumping schedule, parameters of a previous injection treatment, parameters of a future injection treatment, or parameters of a proposed injection treatment. Such parameters may include information on flow rates, flow volumes, slurry concentrations, fluid compositions, injection locations, injection times, or other parameters. The treatment data can include treatment parameters that have been optimized or selected based on numerical simulations of complex fracture propagation.

In some instances, the data 154 include geological data relating to geological properties of the subterranean region 104. For example, the geological data may include information on the wellbore 102, completions, or information on other attributes of the subterranean region 104. In some cases, the geological data includes information on the lithology, fluid content, stress profile (e.g., stress anisotropy, maximum and minimum horizontal stresses), pressure profile, spatial extent, or other attributes of one or more rock formations in the subterranean zone. The geological data can include information collected from well logs, rock samples, outcroppings, microseismic imaging, or other data sources.

In some instances, the data 154 include fracture data relating to fractures in the subterranean region 104. The fracture data may identify the locations, sizes, shapes, and other properties of fractures in a model of a subterranean zone. The fracture data can include information on natural fractures, hydraulically-induced fractures, or any other type of discontinuity in the subterranean region 104. The fracture data can include fracture planes calculated from microseismic data or other information. For each fracture plane, the fracture data can include information (e.g., strike angle, dip angle, etc.) identifying an orientation of the fracture, information identifying a shape (e.g., curvature, aperture, etc.) of the fracture, information identifying boundaries of the fracture, or any other suitable information.

The applications 158 can include software applications, scripts, programs, functions, executables, or other modules that are interpreted or executed by the processor 160. For example, the applications 158 can include a fracture design module, a reservoir simulation tool, a hydraulic fracture simulation model, or any other appropriate function block. The applications 158 may include machine-readable instructions for performing one or more of the operations related to FIGS. 2-4. The applications 158 may include machine-readable instructions for generating a user interface or a plot, for example, illustrating fracture geometry (e.g., length, width, spacing, orientation, etc.), pressure plot, hydrocarbon production performance. The applications 158 can obtain input data, such as treatment data, geological data, fracture data, or other types of input data, from the memory 150, from another local source, or from one or more remote sources (e.g., via the communication link 180). The applications 158 can generate output data and store the output data in the memory 150, in another local medium, or in one or more remote devices (e.g., by sending the output data via the communication link 180).

The processor 160 can execute instructions, for example, to generate output data based on data inputs. For example, the processor 160 can run the applications 158 by executing or interpreting the software, scripts, programs, functions, executables, or other modules contained in the applications 158. The processor 160 may perform one or more of the operations related to FIGS. 2-4. The input data received by the processor 160 or the output data generated by the processor 160 can include any of the treatment data, the geological data, the fracture data, or any other data 154.

Figure 2:
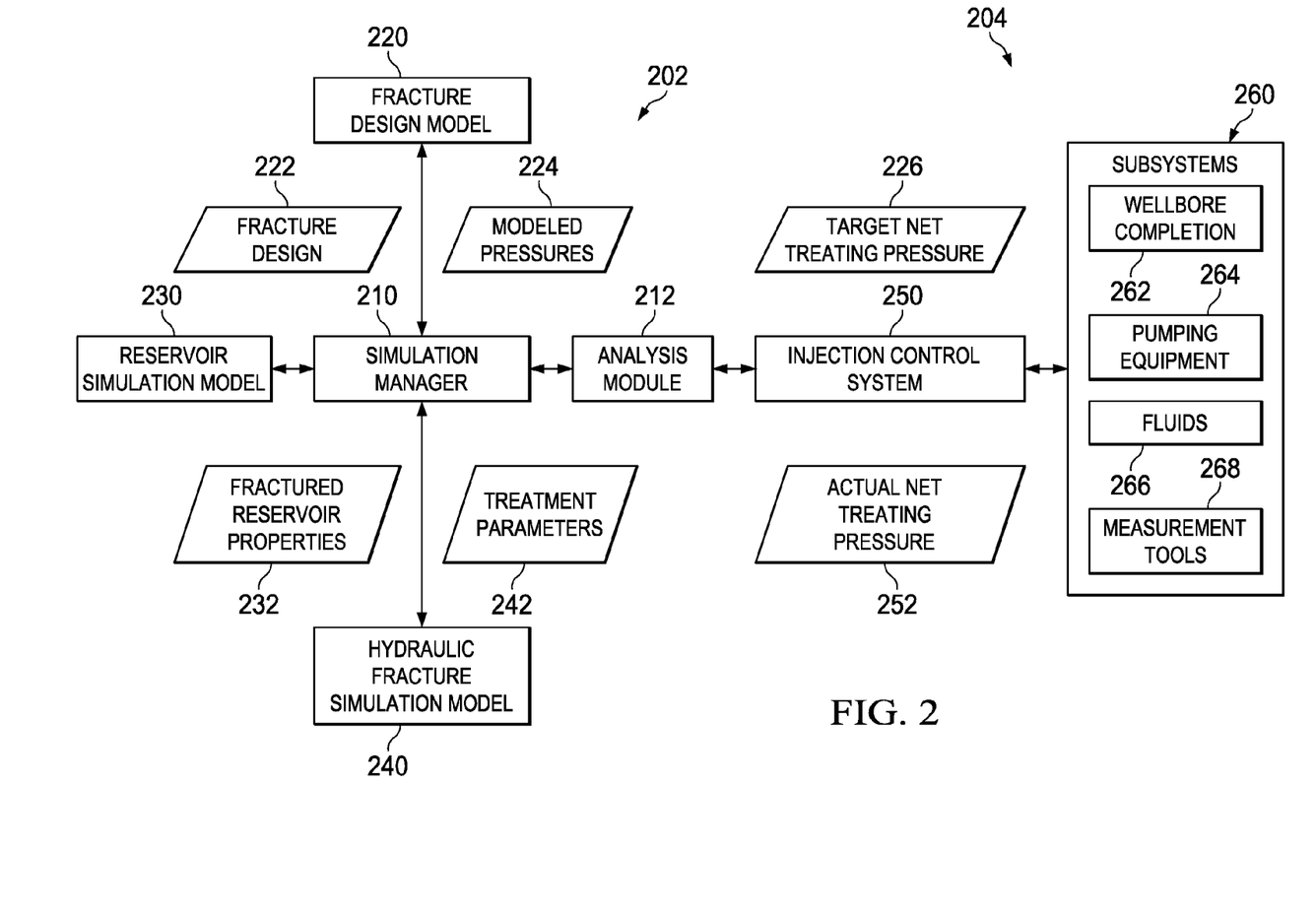
FIG. 2 is a schematic diagram of an example system architecture.

FIG. 2 is a schematic diagram of an example system architecture 200. The example system architecture 200 includes a design system 202 and an injection treatment system 204. A system architecture can include additional or different features. The design system 202 can include a computing system, a design interface or other user-interface tools, various models, and other types of components. In some cases, the design system 202 can be implemented on a computing system such as the example computing subsystem 110 shown in FIG. 1B. The injection treatment system 204 can be implemented in a well system associated with a subterranean region. In some cases, the injection treatment system 204 can be implemented in a well system, such as the example well system 100 shown in FIG. 1A or another type of well system.

Figure 3:
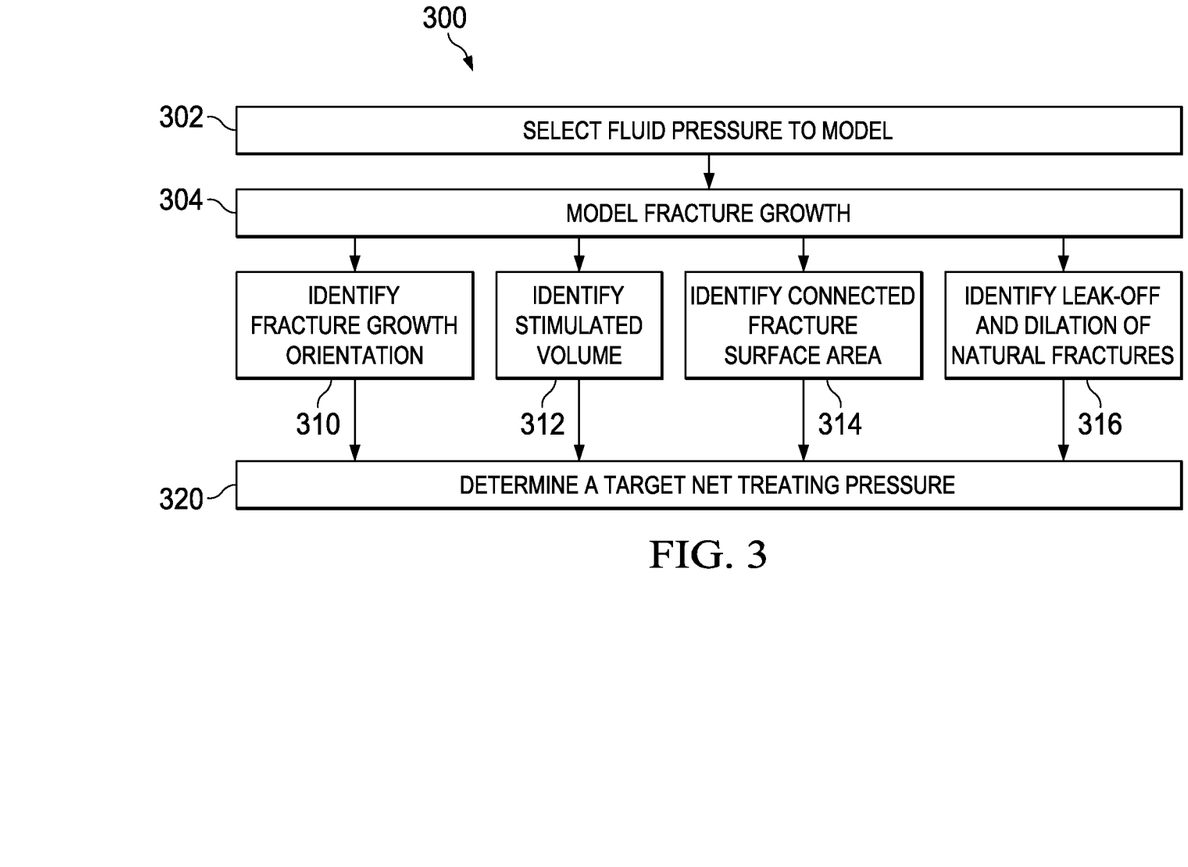
FIG. 3 is a flow chart showing an example technique for determining a target net treating pressure.
Figure 4:
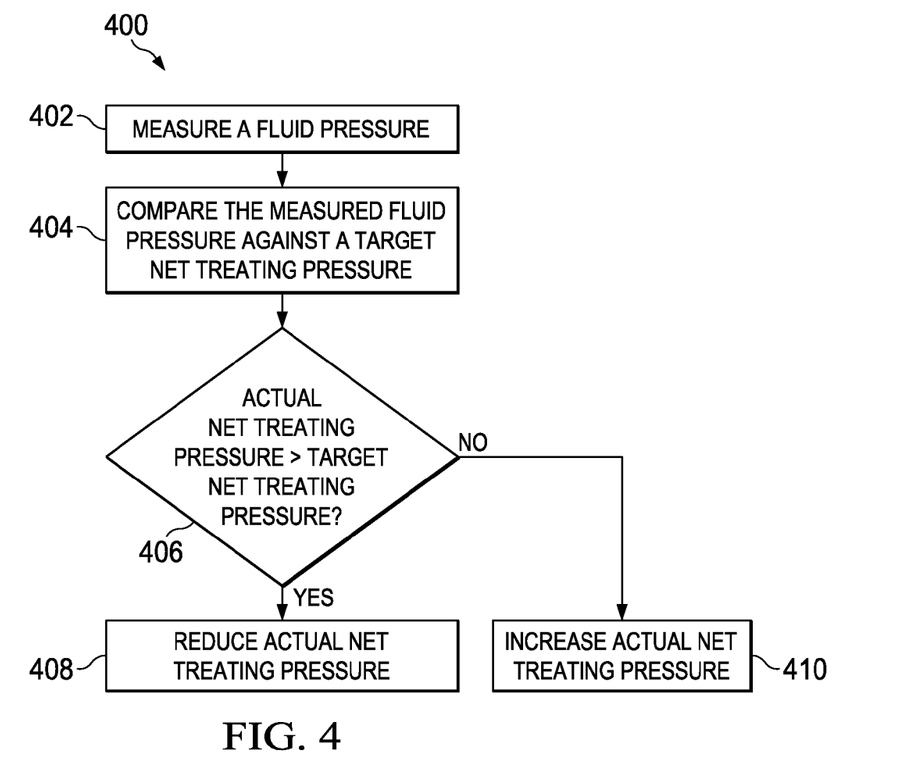
FIG. 4 is a flow chart showing an example technique for controlling a net treating pressure during an injection treatment.

In some cases, the example system architecture 200 can be used to implement some or all of the operations shown in FIGS. 3 and 4, or the system architecture 200 can be used in another manner.

In some implementations, various aspects of the design system 202 and the injection treatment system 204 can interact with each other or operate as mutually-dependent subsystems. In some cases, the design system 202 and the injection treatment system 204 are implemented as separate systems and operate substantially independently of one other. Generally, the design system 202 and the injection treatment system 204 can operate concurrently and execute operations (e.g., in real time) in response to information provided by the other. In some instances, the design system 202 initially generates a design for an injection treatment, and the injection treatment system 204 later receives the design and performs the injection treatment. In some instances, the design system 202 refines the injection treatment design during the injection treatment in response to data and measurements provided by the injection treatment system 204.

The example design system 202 shown in FIG. 2 includes a simulation manager 210, an analysis module 212, a fracture design model 220, a reservoir simulation model 230, and a hydraulic fracture simulation model 240. An injection treatment design system can include additional or different modules, models, and subsystems. In some cases, one or more features of the example design system 202 shown in FIG. 2 can be implemented by one or more of the applications 158 of the computing subsystem 110 shown in FIG. 1B. The example design system 202 can be controlled, monitored, initiated, or managed by one or more design engineers interacting with the design system 202, for example, through a user interface.

The example simulation manager 210 can interact with the example models shown in FIG. 2 or other types of models to simulate an injection treatment. As shown in FIG. 2, the simulation manager 210 may exchange fracture design data 222, modeled pressure data 224, fractured reservoir properties 232, treatment parameters 242, and other information with the models. The example simulation manager 210 can interact with the analysis module 212 or the injection treatment system 204 to exchange (send, receive, or both send and receive) measurement data, simulation data, and other information. In some cases, the analysis module 212 generates the target net treating pressure data 226 based on information from the simulation manager 210. The example analysis module 212 can interact with the injection treatment system 204 to exchange control information, treatment parameters, fracture initialization information, fracture propagation information, real-time pressure conditions and other information.

The example injection treatment system 204 includes an injection control system 250 and multiple subsystems 260. In some examples, the injection control system 250 includes a computing system or another type of system that provides control of the subsystems 260. The example subsystems 260 shown in FIG. 2 include wellbore completion equipment 262, pumping equipment 264, fluids 266, and measurement tools 268. The subsystems 260 can be implemented by pump trucks, control trucks, computing systems, working strings, conduits, communication links, measurement systems, or by combinations of these and other types of equipment in a well system. The injection control system 250 may interact with additional or different subsystems to control an injection treatment. The example injection control system 250 can be controlled or managed by one or more operations engineer interacting with the injection control system 250, for example, through a user interface or controls.

In the example shown in FIG. 2, the injection control system 250 receives the target net treating pressure data 226 from the analysis module 212 and controls one or more of the subsystems 260 based on the target net treating pressure data 226. For example, the measurement tools 268 may generate (e.g., by measurement, computation, etc.) actual net treating pressure data 252 based on a measured fluid pressure; and the injection control system 250 may compare the actual net treating pressure with the target net treating pressure. In some instances, if the actual net treating pressure is outside a range or set of values specified by the target net treating pressure, the injection control system 250 can interface with the wellbore completion equipment 262, the pumping equipment 264, or the fluids 266 to modify the injection treatment.

The fracture design model 220 can be a geomechanical fracture design model, a complex fracture design model, or another type of model. The fracture design model 220 can be used to generate fracture design data 222 that indicate fracture growth and fracture geometry (e.g., length, width, spacing, orientation, etc.) or other fracture property data. The fracture design data 222 can be generated based on modeled fluid pressures acting on the subterranean region during an injection treatment. For example, the simulation manager 210 can send the fracture design model 220 modeled pressure data 224 indicating various fluid pressures to be modeled. In some instances, the fracture design model 220 can model fracture growth in response to different injection parameters (e.g., modeled fluid pressures, etc.), based on modeled rock properties (e.g., modeled rock stresses, etc.). In some instances, the fracture design model 220 can predict or calculate the closure stress, Instantaneous Shut-In Pressure (ISIP), net treating pressure, the stress interference between fractures, or other fracture properties. In some implementations, the fracture design data 222 can be collected by the simulation manager 210 and provided to the reservoir simulation model 230.

The analysis module 212 can use the data produced by one or more of the models (e.g., data from the fracture design model 220, the reservoir simulation model 230, etc.) to determine the target net treating pressure data 226 or another target parameter for an injection treatment. The target net treating pressure data 226 can include a target maximum net treating pressure, or a range of net treating pressures between a minimum target value and a maximum target value. The target maximum net treating pressure can be, for example, a maximum pressure that maintains a desired fracture growth orientation, a pressure that maximizes the exposed surface area, a pressure that maximizes leak off and the dilation of natural fractures, or a pressure that achieves a combination of these or other design goals. In some implementations, the minimum target value can correspond to, for example, a minimum net treating pressure that is needed to create a fracture in the formation, while the maximum target value can correspond to the target maximum net treating pressure. In some implementations, the minimum target value and the maximum target value can be configured as the optimal net treating pressure minus or plus certain error margins. Additional or different aspects can be considered in generating the target net treating pressure data 226.

In some instances, the target net treating pressure data 226 can be determined based on fracture growth orientation indicated by the fracture design data 222 produced by the fracture design model 220. For example, the target net treating pressure can be determined as a maximum net treating pressure that can be sustained during a fracturing treatment without causing a stress reversal or causing the dominant fractures to reorient or grow together. As an example, the fracture design model 220 may model fracture trajectories in response to fluid pressure (e.g., net closure pressure, net treating pressure, etc.) acting on the subterranean region. The fracture growth with respect to different values of the modeled fluid pressure can be simulated. The target net treating pressure can be determined, for example, by identifying a fracture reorientation from the fracture trajectories and locating the value of the modeled fluid pressure that produced the fracture reorientation. As an example, a desired orientation of a dominant fracture can be perpendicular to the least principle stress direction (which, in some cases, is aligned with the wellbore's orientation). If the dominant fractures grow towards a direction aligned with the least principle stress direction (or toward a direction parallel to the orientation of the wellbore), it may imply that the modeled fluid pressure exceeds a desirable net treating pressure value. In some instances, the target net treating pressure can be determined from the modeled fluid pressure based on the occurrence of the fracture reorientation.

In some instances, the target net treating pressure data 226 can be determined based at least in part on the stress contrast or stress anisotropy. The stress anisotropy can refer to the difference between the maximum and least principle stresses. In some instances, as the net pressure approaches the stress anisotropy, natural fractures can more easily dilate and accept fluid and possibly proppant. As a result, the fracture network can have a larger connected fracture surface area, a better fracture conductivity, or a higher effective permeability. On the other hand, in some instances, if the net treating pressure exceeds the stress anisotropy, the fracture growth behavior can be significantly altered to the extent that unfavorable conditions (e.g., dominant fractures growing together) occur. In some cases, if the net treating pressure significantly exceeds the stress anisotropy, the fracture direction may shift by 90 degrees or another angle. In such cases, a dominant fracture may intersect a previous dominant fracture in the same wellbore without further imparting the net treating pressure on the reservoir and thus not creating more connected fracture surface area. Therefore, in some instances, the target net treating pressure can be set as close to the stress anisotropy as possible (e.g., substantially equal to or less than the stress anisotropy). In some aspects, the fracture design model 220 can test the fracture growth in response to multiple fluid pressure values selected in relation to the stress anisotropy and then determine the target net treating pressure based on modeled responses to the multiple selected fluid pressures.

In some implementations, the fracture design model 220 can be executed for a variety of fracture spacing cases, lengths and widths to determine the target net treating pressure, or to establish the optimum net pressure increase. The determined target net treating pressure or the predicted ISIP values can be sent to the injection control system 250 to control the injection treatment. In some implementations, the target net treating pressure or the predicted ISIP values can be used, for example, by a technical professional on location to determine if the desired conditions are being achieved and enable decisions during the course of the treatment and take actions to modify the injection treatment such that, for example, an actual net treating pressure comply with the target net treating pressure.

The reservoir simulation model 230 can be used to identify the number of wells for a reservoir and optimal well completion, to predict the flow and production of fluids (e.g., water, gas, oil, etc.), or to determine any other appropriate parameters and properties of the reservoir. In some instances, the reservoir simulation model 230 can be executed to perform sensitivity analysis to create a desired fracture design based on the fracture design data 222 (for example, in terms of desired fracture length, desired connected surface area, etc.). These parameters can indicate the stimulated volume and the exposed surface area within that volume. The stimulated volume can be the volume of a reservoir which is effectively stimulated to increase the well performance by hydraulic fracturing. The stimulated volume can be directly tied to the drainage volume or estimated ultimate recovery (EUR) for a given well in an unconventional reservoir (e.g., for very low permeability formations such as shale). The connected fracture surface area can influence the ability to accelerate production in an unconventional reservoir. The stimulated volume and the connected fracture surface area can help establish the available reserves that can be produced and the rate at which they can be produced.

The reservoir simulation model 230 may simulate the stimulated volumes and the connected fracture surface areas of multiple fracture designs and help determine a target net treating pressure. In some instances, each fracture design can be, for example, provided by the fracture design model 220 with a corresponding net treating pressure. The fracture designs can include one or more of dominant fractures, natural fractures or fissures, with certain fracture properties (e.g., average fracture length, width, spacing, etc.). The time evolution of the exposed fracture surface area and the accumulated hydrocarbon production of the multiple facture designs can be simulated and recorded. An optimal or a desired fracture design can be determined, for example, by identifying the fracture design that returns the most production volume or at the highest production rate.

In some instances, the target net treating pressure can be identified based on the optimal or the desired fracture design with the corresponding net treating pressure. In some instances, the reservoir simulation model 230 can use the net treating pressure data when simulating the stimulated volumes and the connected fracture surface areas of one or more fracture designs. For instances, the reservoir simulation model 230 may vary the net treating pressure acting on the subterranean area for a certain fracture design. In some instances, increasing the net treating pressure can dilating the natural fractures, inducing leak off of the hydraulic fracturing fluid into the natural fractures. Dilating and inducing more leak off induced fractures can increase the connected fracture surface area. The reservoir simulation model 230 can evaluate the impacts of the net treating pressure on the stimulated volume and the connected fracture surface area and help determine a target net treating pressure, for example, by identifying a net treating pressure that maximizes one or both of the stimulated volume and the connected fracture surface area of a fracture design.

In some implementations, a reservoir simulation model 230 can assess the impact of the fracture design on well productivity modeling. For example, a reservoir simulation tool capable of modeling Discrete Fracture Networks (DFN) may model the DFN as a combination of parallel hydraulic fractures and orthogonal natural fractures. In some instances, hydraulic fracture properties including width, height, length, conductivity, etc. and natural fracture properties including fracture density, fracture length, fracture conductivity, etc. can be specified in the reservoir simulation. Being able to specify and vary the natural fracture density and conductivity while honoring the reservoir matrix permeability can help develop more realistic production predictions based upon the net treating pressure achieved. In some instances, the reservoir simulation tool can help evaluate the impact of natural fractures or fissures intersecting the dominant fracture on the production potential from a well. Some example simulations results have shown that, in some instances, a single dominant fracture can have less total gas production and a lower gas production rate than a fracture network with the dominant facture intersecting multiple fractures or fissures. As a result, the single dominant fracture regime (e.g., fractures resembling a spear of asparagus) may be less productive than the dilated a natural fracture network regime (e.g., a fracture network resembling a head of broccoli). In some shale reservoirs, dilation of natural fractures can open these fracture systems and potentially prop them open sufficiently to retain adequate fracture conductivity to flow fluids back to the dominant fracture and into the well. Since the matrix permeability in some of these types of reservoirs is so low, the dilation of these natural fractures can increase the connected fracture area and the effective permeability so the well can produce at higher production rates. In some implementations, the reservoir simulation model 230 can also be used to history match production to provide a means to calibrate the design tool for new wells.

The hydraulic fracture simulation model 240 can be used to determine treatment parameter data 242 for achieving a desired fracture design. For example, the fractured reservoir properties data 232 can be generated by the reservoir simulation tool 230 and serve as an input into the hydraulic fracture simulation model 240. The desired fracture design may include fracture geometry, for example, fracture length, volume of fluid leaked off into the natural fracture systems, or any other appropriate information. The hydraulic fracture simulation model 240 can determine the required treatment parameters 242 including injection plan (e.g., where to inject, how many fracturing stages, etc.), or other properties of an injection treatment (e.g., flow volume, fluid type, injection rate, proppant type, proppant concentrations, etc.) to achieve desired fracture network properties. In some implementations, pressure sensitive leak off coefficients can be used to simulate the leak off of fluid into the natural fractures and generate a treatment pumping schedule including injection rates, treatment volumes, proppant concentrations and proppant volume. The treatment parameters 242 can be collected by the simulation manager 210 and communicated to the injection control system 250 or one or more of the subsystems 260.

The injection control system 250 can control operations of the subsystems 260. The injection control system 250 may include a user interface that can be operated by a user to access, input, modify, or otherwise manipulate the injection parameters; the injection control system 250 may include computer-implemented algorithms that can automatically control the subsystems 260; or injection control system 250 can operate based on a combination of computer-implemented algorithms and user-controlled criteria. The injection control system 250 can include one or more features of the injection treatment control subsystem 111 described with respect to FIG. 1A. In some instances, the injection control system 250 may receive (e.g., from the simulation manager 210, from the analysis module 212, or another source) treatment parameter data 242, target net treating pressure data 226, or any other appropriate information related to the injection treatment to be applied to a subterranean region. In some instances, the injection control system 250 may modify the received injection treatment information; or the injection control system 250 may generate new treatment parameters or control information to configure the subsystems 260 or other equipment to execute aspects of the injection treatment plan.

In some instances, the injection control system 250 may receive data collected from the subterranean region by sensing equipment or field tests, process the data or otherwise use the data to select or modify properties of an injection treatment to be applied to the subterranean region. For example, the injection control system 250 may receive a measurement of a surface pressure, a bottom hole treating pressure, a facture closure pressure, Instantaneous Shut In Pressure (ISIP), in-situ stresses, fluid loss, leak off rate, or any other appropriate information. Such information may be collected from sensing equipment (e.g., flow meters, pressure sensors, tiltmeters, geophones, microseismic detecting devices, fiber optic sensors for distributed temperature and/or acoustic etc.) before, during, or after an injection treatment, or determined by a logging run with a dipole sonic wellbore logging instrument, a wellbore breakout analysis, an injection test (e.g., an in-situ stress test, a minifracture test, a pump-in/flowback test, etc.), a fracturing analysis (e.g., step-rate analysis, step down analysis, regression analysis, derivative method, etc.), an after-closure analysis, or another technique. As an example, the net treating pressure can be determined, for example, based on one or more of the surface pressure, the bottom hole pressure, the facture closure pressure, or other information. As another example, during completion, a Diagnostic Fracture Injection Test (DFIT) can be performed to evaluate the real leak off rates to validate the assumed values used during the treatment design and modify the pumping schedule (e.g., injection rate, fluid type, proppant type, proppant concentration, diverter, etc.) as necessary.

In some implementations, the injection control system 250 may control the subsystems 260 to maintain an actual net treating pressure that is consistent with the target net treating pressure, for example, to achieve desirable fracture growth. The actual net treating pressure can be determined, for example, based on the monitored treating pressure during the pumping or the recorded ISIP. The actual net treating pressure can be monitored and compared with a target net treating pressure. Adjustments of the actual net treating pressure can be made based on the comparison result as whether to increase or reduce the actual net treating pressure. In some implementations, the adjustments can include modifying one or more injection parameters (e.g., pumping pressure, adding diversion materials, change proppant size, proppant type, proppant concentration, etc.) instantaneously. In some implementations, the adjustments can include modifying injection schedules that have a prospective effect on the actual net treating pressure in the subterranean area (for example, modifying the pumping schedule of a next stage fracturing treatment based on fracture conditions of the current stage, altering fracture or perforation spacing between treatment stages based on the observed treating pressure condition). The above process can be performed by a technical professional on location interacting with the injection control system 250 or one or more of the subsystems 260, or by the injection control system 250 with automatic algorithms or any other appropriate techniques.

In some instances, if the net treating pressure is below the target net treating pressure range, the subsystems 260 can be manipulated, for example, by the injection control system 250, to increase the actual net treatment pressure, for example, by pumping controls, diversion solutions, stress interference, or other techniques. Diversion methods can induce partial screen outs by pumping proppants or degradable material into the fracture network to increase the net treating pressure and create secondary fractures. The subsystems 260 may use or include AccessFrac or CobraMax DM family of products and services developed by Halliburton Energy Services, Inc., for example, to perform real time diversion to monitoring and maintaining the net treating pressure within the target net treating pressure range. In some implementations, additional or fewer diversion stages can be used to help achieve and maintain the desired net treating pressure. Stress interference methods can use the altered effective stress state in the rock by using fractures created in a nearby well or zone to generate favorable conditions for fracture creation. Local stress interference can increase fracture complexity through the interaction of multiple fractures in the same well or nearby wells. Altering the sequence of fracture placement and alternating treatments in different wellbores can help increase fracture complexity in suitable reservoir conditions. The local stress interference can be performed sequentially to take advantage of localized stress alterations. The subsystems 260 may use or include Cobra-Max ASF, Zipper Frac, or other fracturing technologies developed by Halliburton Energy Services, Inc., for example, to alter stresses and improve the complexity of the fracture network. Another technique for increasing or decreasing the stress interference between fractures is to alter perforation or fracture spacing. In some instances, a closer spacing between perforations or fractures can lead to more stress interference, while a larger spacing between perforations or fractures may result in less interference between fractures. The perforations or fractures spacing between treatment stages can be altered (for example, during plug and perforation procedures) based on the observed net treating pressure condition, for example, to control the degree of the stress interference in the rock formation. The perforations or fractures spacing can be optimized to make use of the resulting stress interference to achieve and maintain the target net treating pressure.

In some instances, if the net treating pressure is above the target net treating pressure range, the subsystems 260 can be manipulated, for example, by the injection control system 250, to reduce the net treatment pressure, for example, by decreasing a pumping rate, decreasing a pumping pressure, adding materials to temporarily block the path created by the over-pressure events, etc.

One or more of the subsystems 260 can operate together to perform an injection treatment by injecting fluid into a subterranean region (e.g., the subterranean region 104). The subsystems 260 can include one or more features of the example injection system 108 described with respect to FIG. 1A. The subsystems 260 can be controlled by the injection control system 250 to perform the injection treatment based on the treatment parameters (e.g., injection rate, fluid type, proppant type, proppant concentration, etc.), pumping schedule, and planned fracture or perforation spacing between injection stages. Additional or alternatively, the subsystems 260 can also be controlled by one or more technical professionals on location to adjust the treatment parameters and schedules, for example, to improve the fracture growth behavior, and maximize the production potential. The subsystems 260 can be controlled in real time or dynamically.

FIG. 3 is a flow chart showing an example process 300 for determining a target net treating pressure. All or part of the example process 300 may be computer-implemented, for example, using the features and attributes of the example computing subsystem 110 shown in FIG. 1B or other computing systems. The process 300, individual operations of the process 300, or groups of operations may be iterated or performed simultaneously to achieve a desired result. In some cases, the process 300 may include the same, additional, fewer, or different operations performed in the same or a different order.

At 302, a fluid pressure is selected for modeling fracture growth. The fluid pressure can be a surface pressure, a bottom hole pressure, a net treating pressure, a combination of these and other fluid pressures acting on a subterranean region. The fluid can be a treatment fluid, a hydrocarbon fluid, or another fluid. The fluid pressure can be selected as a parameter of a fracture design model or a reservoir simulation model, for example, to simulate a fracture growth, stimulated volume, or a connected surface area. In some instances, one or more fluid pressures can be selected and modeled to simulate the fracture growth. In some implementations, the fluid pressure can be selected in relation to the difference between the minimum and maximum horizontal stresses in the subterranean region. The values of the one or more fluid pressures can be adjusted to identify their impacts on, for example, fracture orientation, fracture dilation, fracture volume, connected fracture surface area, leak-off, or any other appropriate properties of the fracture network.

At 304, fracture growth is modeled, for example, by a computer system using a fracture design model. The computer system and the fracture design model can include, for example, the features of the simulation manager 210 and the fracture design model 220 described with respect to FIG. 2, respectively. In some instances, the modeled fracture growth includes propagation of dominate fractures, dilation or creation of nature fractures or fissures, intersections among fractures, or any additional or different changes of the fracture network due to an injection treatment in the subterranean region.

At 310, orientations of the fracture growth can be identified. For example, the fracture growth orientation can be identified based on a fracture trajectory generated by the fracture design model. The fracture trajectory can include a plot that illustrates a simulated topology or growth of a dominant fracture during an injection treatment with a modeled fluid pressure. In some implementations, the injection treatment can include a multi-stage fracturing treatment, and the fracture trajectory can include the simulated propagations of multiple dominant fractures during the multi-stage fracturing treatment. Identical or different modeled fluid pressures can be applied on the subterranean region during the multiple stages of the fracture treatment modeling. In some cases, certain values of the modeled fluid pressure may lead to reorientations of the fractures. For example, in some instances, a preferred growth orientation of the dominate fracture can be perpendicular to a minimum stress orientation in the subterranean region. An excessive fluid pressure may cause the dominant fractures to stray away from the desired orientation or even cause intersections other dominant fractures initiated (e.g., at other stages) by the multi-stage fracture treatment.

At 312, stimulated volume can be identified. At 314, connected fracture surface in the subterranean region can be identified. At 316, dilation of the natural fracture and leak off of the fluid into the natural fracture can be identified. The stimulated volume, connected fracture surface, dilation of the natural fracture or leak off can be identified, for instance, using a reservoir simulation model or a hydraulic fracturing simulation model. In some implementations, the reservoir simulation tool can simulate or determine the stimulated volume and connected fracture surface area of a fracture design in response to the fluid pressure such as the net treating pressure. An optimal fracture design that maximizes at least one of the stimulated volume and connected fracture surface area can be identified. In some instances, the simulated or determined connected fracture surface area can include information related to the dilated or leak-off induced natural fractures. Dilating the nature fracture or inducing leak off into the natural fractures in the subterranean region can increase an effective permeability of the subterranean region and can increase the connected surface area in some instances.

At 320, a target net treating pressure for fluid acting on the subterranean region during an injection treatment is determined. The target net treating pressure can be determined based on one or more of the fracture orientation, the connected fracture surface area, the fracture stimulated volume, the dilation of natural fractures, the leak off of the fluid into the natural fracture, or any combination of these or other properties. The target net treating pressure can include a maximum net treating pressure associated with a fracture growth orientation that is perpendicular to a minimum stress orientation in the subterranean region. In some instances, the target net treating pressure is a range of net treating pressures between a minimum target value and a maximum target value. In some instances, a target maximum net treating pressure may refer to a maximal net treating pressure that can be achieved before fracture reorientation occurs resulting in a sub-optimum (reduced) connected surface area. For multi-stage fracturing treatments, the target net treating pressure can be selected to propagate one or more of multiple non-intersecting dominant fractures initiated by the multi-stage fracture treatment. In some implementations, the net treating pressure can be determined based on one or more of the modeled fluid pressures. For example, the maximum target net treating pressure can be determined in relation to the difference between minimum and maximum horizontal stresses in the subterranean region.

In some instances, the maximum target net treating pressure can be determined based on maximizing at least one of the connected fracture surface area or the stimulated volume. In some instances, the target net treating pressure is determined as a net treating pressure that dilates natural fractures in the subterranean region and propagates dominant fractures perpendicular to a minimum stress orientation in the subterranean region. In some cases, the target net treating pressure dilates the natural fractures by inducing leak-off from the dominant fractures, where dilating the natural fractures in the subterranean region increases an effective permeability of the subterranean region.

FIG. 4 is a flow chart showing an example process 400 for controlling a net treating pressure during an injection treatment. All or part of the example process 400 may be implemented in a well system, for example, using one or more of the features and attributes of the example well system 100 shown in FIG. 1A. In some cases, aspects of the example process 400 may be performed in a single-well system, a multi-well system, a well system including multiple interconnected wellbores, or in another type of well system, which may include any suitable wellbore orientations. In some implementations, the example process 400 is implemented to form a fracture network in a subterranean formation that will improve resource production. For example, hydraulic fracturing from horizontal wells in shale reservoirs or other low permeability reservoirs may improve the production of natural gas from these low permeability reservoirs. The process 400, individual operations of the process 400, or groups of operations may be iterated or performed simultaneously to achieve a desired result. In some cases, the process 400 may include the same, additional, fewer, or different operations performed in the same or a different order.

At 402, a fluid pressure is measured. The fluid pressure can include a treating pressure, a net treating pressure, a closure pressure, a net closure pressure, a surface pressure, a bottom hole pressure, ISIP, any additional or different fluid pressure acting on a subterranean region. The fluid pressure can be measured by receiving data collected from the subterranean region by sensing equipment or field tests, or by processing the data or otherwise using the data. For example, the fluid pressure can be an actual net treating pressure that is determined based on, for example, a detected bottom hole pressure, and a facture closure pressure determined by a fracture test or analysis.

At 404, the measured fluid pressure is compared against a target net treating pressure for fluid acting on the subterranean region during the injection treatment. The fluid pressure can be monitored and compared against the target net treating pressure during an injection treatment continuously, at predetermined time points, etc. The target net treating pressure can be associated with a target orientation of fracture growth. In some instance, the target net treating pressure can be the target net treating pressure described with respect to FIGS. 2-3.

At 406, a determination can be made whether an actual net treating pressure acting on the subterranean region exceeds the target net treating pressure. Based on a result of the comparison, the injection treatment can be modified (e.g., if modification is determined to be necessary, useful, advantageous, or otherwise appropriate based on the comparison and possibly other factors). In some instances, modifying the injection treatment can include one or both of modifying an instantaneous injection treatment parameter (e.g., pumping pressure of the hydraulic fracturing fluid, injection rate, fluid type, proppant type and concentration, fracture diversion, fracture or perforation spacing between treatment stages, etc.), or modifying a prospective injection schedule (e.g., injection schedules of future treatment stages etc.). In some implementations, the modification can be performed in real time on location by an injection control system with or without input from a technical professional.

At 408, the actual net treating pressure can be reduced if the actual net treating pressure acting on the subterranean region exceeds the target net treating pressure. For instance, the actual net treating pressure can be reduced by reducing a fluid pressure applied by the injection treatment. Additional or different techniques can be used to reduce the actual net treating pressure. In some implementations, blocking material is injected into the subterranean region to block a fracture path in the subterranean region. The blocking material can include temporary blocking materials (e.g., dissolvable particles, etc.), permanent blocking materials (e.g., rock particles, etc.), or a combination of these and other types of blocking materials. As such, the blocking materials can temporarily block a flow path in the subterranean region (e.g., for a specified amount of time), the blocking materials can permanently block a flow path in the subterranean region (e.g., for an indefinitely long period of time), or some combination of these. In some cases, the actual net treating pressure is adjusted to be as close as possible or practical to the target net treating pressure without exceeding it.

At 410, the actual net treating pressure can be increased if the target net treating pressure exceeds the actual net treating pressure acting on the subterranean region. For instance, the actual net treating pressure can be increased by increasing a fluid pressure applied by the injection treatment. In some implementations, the actual net treating pressure can be increased by using diversion methods, stress interference, or a combination of these and other techniques.

In some implementations, some or all of the operations in the process 400 are executed in real time during a fracture treatment. An operation can be performed in real time, for example, by performing the operation in response to receiving data (e.g., from a sensor or monitoring system) without substantial delay. An operation can be performed in real time, for example, by performing the operation while monitoring for additional data from the fracture treatment. Some real time operations can receive an input and produce an output during a fracture treatment; in some instances, the output is made available (e.g., to a user or another system) within a time frame that allows a respond to the output, for example, by modifying the fracture treatment.

Some embodiments of subject matter and operations described in this specification can be implemented in digital electronic circuitry, or in computer software, firmware, or hardware, including the structures disclosed in this specification and their structural equivalents, or in combinations of one or more of them. Some embodiments of subject matter described in this specification can be implemented as one or more computer programs, i.e., one or more modules of computer program instructions, encoded on computer storage medium for execution by, or to control the operation of, data processing apparatus. A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and processors of any kind of digital computer. Generally, a processor will receive instructions and data from a read only memory or a random access memory or both. A computer includes a processor for performing actions in accordance with instructions and one or more memory devices for storing instructions and data. A computer may also include, or be operatively coupled to receive data from or transfer data to, or both, one or more mass storage devices for storing data, e.g., magnetic, magneto optical disks, or optical disks. However, a computer need not have such devices. Devices suitable for storing computer program instructions and data include all forms of non-volatile memory, media and memory devices, including by way of example semiconductor memory devices (e.g., EPROM, EEPROM, flash memory devices, and others), magnetic disks (e.g., internal hard disks, removable disks, and others), magneto optical disks, and CD ROM and DVD-ROM disks. The processor and the memory can be supplemented by, or incorporated in, special purpose logic circuitry.

To provide for interaction with a user, operations can be implemented on a computer having a display device (e.g., a monitor, or another type of display device) for displaying information to the user and a keyboard and a pointing device (e.g., a mouse, a trackball, a tablet, a touch sensitive screen, or another type of pointing device) by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

A client and server are generally remote from each other and typically interact through a communication network. Examples of communication networks include a local area network ("LAN") and a wide area network ("WAN"), an inter-network (e.g., the Internet), a network comprising a satellite link, and peer-to-peer networks (e.g., ad hoc peer-to-peer networks). The relationship of client and server arises by virtue of computer programs running on the respective computers and having a client-server relationship to each other.

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple embodiments separately or in any suitable subcombination.

A number of embodiments have been described. Nevertheless, it will be understood that various modifications can be made. Accordingly, other embodiments are within the scope of the following claims.

The invention claimed is:

1. An injection treatment design method comprising:
    modeling, by a computer system, fracture growth in a subterranean region, the modeled fracture growth indicating a fracture growth orientation in response to a modeled fluid pressure acting on the subterranean region; and determining, by the computer system, based on the fracture growth orientation, a target net treating pressure for fluid acting on the subterranean region during an injection treatment of the subterranean region.

2. The method of claim 1, comprising determining a target net treating pressure that:
   dilates natural fractures in the subterranean region; and
   propagates dominant fractures perpendicular to a minimum stress orientation in the subterranean region.

3. The method of claim 2, wherein the target net treating pressure dilates the natural fractures by inducing leak-off from the dominant fractures, and dilating the natural fractures in the subterranean region increases an effective permeability of the subterranean region.

4. The method of claim 1, comprising determining a maximum net treating pressure in relation to the difference between minimum and maximum horizontal stresses in the subterranean region.

5. The method of claim 4, comprising:
   selecting modeled fluid pressures in relation to the difference between the minimum and maximum horizontal stresses in the subterranean region; and
   determining the target net treating pressure based on one or more of the modeled fluid pressures.

6. The method of claim 1, comprising:
   identifying, based on the modeling, connected fracture surface area and stimulated volume in the subterranean region; and
   determining the target net treating pressure based on maximizing at least one of the connected fracture surface area or the stimulated volume.

7. The method of claim 1, comprising determining a maximum net treating pressure associated with a fracture growth orientation that is perpendicular to a minimum horizontal stress orientation in the subterranean region.

8. The method of claim 1, wherein the target net treating pressure comprises a range of net treating pressures between a minimum target value and a maximum target value.

9. The method of claim 1, wherein the injection treatment includes a multi-stage fracturing treatment, and the target net treating pressure is selected to propagate one or more of multiple non-intersecting dominant fractures initiated by the multi-stage fracture treatment.

10. The method of claim 1, comprising determining a target net treating pressure based on information generated by a fracture design model, a reservoir simulation model, and a hydraulic fracture simulation model.

11. A non-transitory computer-readable medium storing instructions that, when executed by data processing apparatus, perform operations comprising:
   modeling fracture growth in a subterranean region, the modeled fracture growth indicating a fracture growth orientation for a modeled fluid pressure acting on the subterranean region; and
   determining, based on the fracture growth orientation, a target net treating pressure for fluid acting on the subterranean region during an injection treatment of the subterranean region.

12. The computer-readable medium of claim 11, comprising determining a target net treating pressure that:
   dilates natural fractures in the subterranean region; and
   propagates dominant fractures perpendicular to a minimum stress orientation in the subterranean region.

13. The computer-readable medium of claim 12, the operations comprising determining a target net treating pressure that dilates the natural fractures by inducing leak-off from the dominant fractures, wherein dilating the natural fractures in the subterranean region increases an effective permeability of the subterranean region.

14. The computer-readable medium of claim 11, the operations comprising determining a maximum net treating pressure in relation to the difference between minimum and maximum horizontal stresses in the subterranean region.

15. The computer-readable medium of claim 14, the operations comprising:
   selecting the modeled fluid pressures in relation to the difference between the minimum and maximum horizontal stresses in the subterranean region; and
   determining the target net treating pressure based on one or more of the modeled fluid pressures.

16. The computer-readable medium of claim 11, the operations comprising:
   identifying, based on the modeling, connected fracture surface area and stimulated volume in the subterranean region; and
   determining the target net treating pressure based on maximizing at least one of the connected fracture surface area or the stimulated volume.

17. The computer-readable medium of claim 11, the operations comprising determining a maximum net treating pressure associated with a fracture growth orientation that is perpendicular to a minimum horizontal stress orientation in the subterranean region.

18. The computer-readable medium of claim 11, wherein the injection treatment includes a multi-stage fracturing treatment, and the target net treating pressure is selected to propagate one or more of multiple non-intersecting dominant fractures initiated by the multi-stage fracture treatment.

19. An injection treatment design system comprising one or more computers that include:
   a modeling module operable to model fracture growth in a subterranean region, the modeled fracture growth defining a fracture growth orientation for a modeled fluid pressure acting on the subterranean region; and
   an analysis module operable to determine, based on the fracture growth orientation, a target net treating pressure for fluid acting on the subterranean region during an injection treatment of the subterranean region.

20. The injection treatment design system of claim 19, wherein the analysis module is operable to determine a target net treating pressure that:
   dilates natural fractures in the subterranean region; and
   propagates dominant fractures perpendicular to a minimum stress orientation in the subterranean region.

21. The injection treatment design system of claim 20, wherein the analysis module is operable to determine a target net treating pressure that dilates the natural fractures by inducing leak-off from the dominant fractures.

22. The injection treatment design system of claim 19, wherein the analysis module is operable to determine a maximum net treating pressure in relation to the difference between minimum and maximum horizontal stresses in the subterranean region.

23. The injection treatment design system of claim 19, comprising one or more simulators that are operable to:
   identify, based on the modeling, connected fracture surface area and stimulated volume in the subterranean region; and
   determine the target net treating pressure based on maximizing at least one of the connected fracture surface area or the stimulated volume.

24. The injection treatment design system of claim 19, wherein the analysis module is operable to determine a maximum net treating pressure associated with a fracture growth orientation that is perpendicular to a minimum stress orientation in the subterranean region.

25. The injection treatment design system of claim 19, wherein the injection treatment includes a multi-stage fracturing treatment, and the target net treating pressure is selected to propagate one or more of multiple non-intersecting dominant fractures initiated by the multi-stage fracture treatment.

26. The injection treatment design system of claim 19, wherein the modeling module includes a fracture design model, a reservoir simulation model, and a hydraulic fracture simulation model.

* * * * *